United States Patent [19]

Schneider

[11] Patent Number: 5,142,432
[45] Date of Patent: Aug. 25, 1992

[54] FAULT DETECTION APPARATUS FOR A TRANSFORMER ISOLATED TRANSISTOR DRIVE CIRCUIT FOR A POWER DEVICE

[75] Inventor: Eric D. Schneider, Carmel, Ind.

[73] Assignee: General Motors Corporation, Detroit, Mich.

[21] Appl. No.: 779,766

[22] Filed: Oct. 21, 1991

[51] Int. Cl.⁵ .............................................. H02H 9/04
[52] U.S. Cl. ...................................... 361/91; 361/86; 361/56; 340/662
[58] Field of Search ....................... 361/18, 78, 79, 86, 361/87, 88, 89, 91, 93, 101, 56; 323/289; 363/56; 307/300, 350, 570, 571; 340/662

[56] References Cited

U.S. PATENT DOCUMENTS

| | | | |
|---|---|---|---|
| 4,423,457 | 12/1983 | Brajder | 361/86 |
| 4,511,815 | 4/1985 | Wood | 307/584 |
| 4,551,779 | 11/1985 | Murakami et al. | 361/86 |
| 4,686,383 | 8/1987 | Croft | 361/98 |
| 4,859,921 | 8/1989 | Archer | 318/599 |
| 4,893,211 | 1/1990 | Bynum et al. | 361/18 |
| 4,908,857 | 3/1990 | Burns et al. | 379/418 |
| 4,937,727 | 6/1990 | Leonardi | 363/97 |
| 4,967,332 | 10/1990 | Claydon et al. | 363/17 |
| 4,979,068 | 12/1990 | Sobhani et al. | 361/18 |
| 5,019,719 | 5/1991 | King | 307/246 |

Primary Examiner—A. D. Pellinen
Assistant Examiner—C. Schultz
Attorney, Agent, or Firm—Mark A. Navarre

[57] ABSTRACT

A protection circuit which electrically isolates logic level and high-side circuits and detects high side power device fault conditions at the isolated, logic level side of the circuit. When an overvoltage or overcurrent condition occurs at the power switching device, a protection circuit disables the conduction of current through the current carrying terminals of the switching device, preventing damage from occurring to the device. Activation of the protection circuit effects an increased current flow in the secondary and primary coils of the isolation transformer between the low side and high side elements. Voltage at the primary coil of the isolation transformer is monitored by low level circuitry to detect the rise in current, indicating a fault to the system controller upon detection.

4 Claims, 2 Drawing Sheets

FAULT DETECTION APPARATUS FOR A TRANSFORMER ISOLATED TRANSISTOR DRIVE CIRCUIT FOR A POWER DEVICE

This invention relates to a power transistor drive circuit in which the low level control logic circuitry is transformer isolated from the power transistor, and more particularly to circuitry responsive to the occurrence of overvoltage and overcurrent conditions.

BACKGROUND OF THE INVENTION

Isolation transformers are used in application where low level logic components activate high power switching devices. While the power required to drive the logic level components is relatively low, the voltages and load currents found across power switching devices are often much higher than the low level circuit can withstand. In situations where high voltages and currents propagate to the low level logic components, damage to the logic level components could result. To prevent such a situation, and to provide noise immunity, isolation transformers are frequency employed to provide the necessary electrical isolation between the logic components and the power switching device. In addition, because isolation transformers may be used in drive applications where a controller activates power switching devices, it is desirable to be able to alert the controller to overvoltage or overcurrent conditions present at any of the switching devices.

Accordingly, an isolation and fault detection apparatus must provide both sufficient isolation between the high voltage and low level logic components and a method of fault detection to alert the system controller. Furthermore, any isolation and fault detection apparatus must operate at a speed sufficient to allow the controller to activate the power switching device at a desired rate. Present methods of isolation and fault detection require two isolation transformers. One isolation transformer is an input device activated by the logic level components to energize the power switching device. A second isolation transformer is driven by circuits that sense overvoltage or overcurrent conditions at the power device and indicates such a fault condition to the controller. The logic level side of the second isolation transformer is monitored to determine if an error condition has occurred on that power device. It is elimination of the second isolation transformer to which this invention is directed.

SUMMARY OF THE PRESENT INVENTION

The present invention is directed to an improved protection circuit which electrically isolates logic level and power circuits of a power transistor drive circuit and also detects power circuit fault conditions at the isolated, logic level side of the circuit. When an overvoltage or overcurrent condition occurs at the power transistor, a protection circuit disables the conduction of current between the transistor current carrying terminals, preventing damage to the device. When the protection circuit disables the power switching device, a change in the current occurs at the isolated, low level logic circuit. This change in current is detected by a low level circuit that indicates to a controller that a fault condition has occurred.

According to this invention, a power device is activated by the application of low level clock signals to the primary side of an isolation transformer. The secondary coil of the transformer drives the input of a bridge rectifier which demodulates the signal into a DC drive signal. The DC signal is applied to the gate terminal of the power device. Application of the DC signal to the gate terminal enables conduction of load current between the current carrying terminals of the power device. When so activated, if an overvoltage or overcurrent condition occurs at the power switching device, protection circuitry is engaged to shunt the gate terminal to the source terminal of the power device, preventing the power device from conducting current and protecting it from potentially damaging voltages and currents.

Furthermore, once the protection circuit is engaged, a low resistance path that includes the secondary coil of the isolation transformer is created, resulting in increased current conduction through the secondary coil. A corresponding increase in current conduction also occurs at the primary coil of the isolation transformer due to transformer action. The current increase results in a voltage increase at output of drivers which apply the clock signals to the primary coil of the isolation transformer. Voltage at the output of the drivers is periodically sensed to determine if it exceeds a threshold level. When the threshold level is exceeded, a fault signal indicates to the controller that a fault condition has occurred.

DETAILED DESCRIPTION OF THE INVENTION

Figure 1:
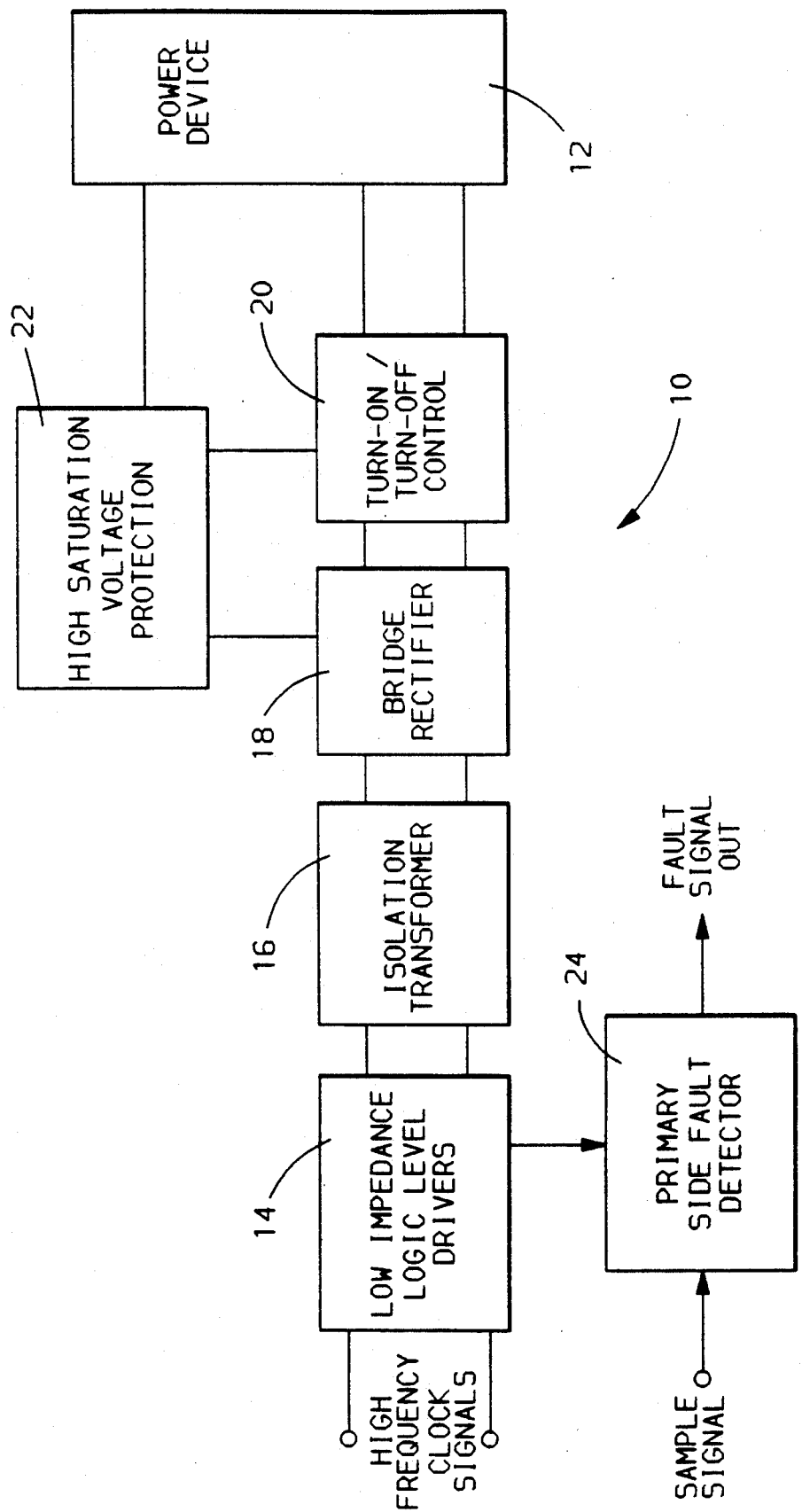
FIG. 1 is a block diagram of the primary side fault detection apparatus.

Referring to FIG. 1, circuit 10 is employed to bias a high power device 12, such as an insulated gate bipolar transistor (IGBT) or a power MOSFET, conductive and nonconductive. Power device 12 may be used in a variety of applications which require switching devices capable of withstanding significant voltages. Such a power device is particularly well suited to use as a switching element in a high voltage bridge inverter application.

In circuit 10, a control signal is generated by a controller (not shown) to bias power device 12 conductive. As embodied here, this control signal consists of a pair of high frequency (on the order of 500 kHz to 700 kHz) square wave clock signals which operate 180 degrees out of phase. The clock signals drive low impedance logic level drivers 14 whose output creates an alternating current AC signal at the primary coil of one-to-one isolation transformer 16. The secondary coil of isolation transformer 16 drives the inputs of bridge rectifier 18 which demodulates the AC signal into a direct current (DC) signal. The DC signal is applied to the gate terminal of power device 12 to bias it conductive and enable conduction of load current between the current carrying terminals of power device 12. Because of the inherent gate-to-source capacitance of a power semiconductor, it is necessary to control the rate at which the gate terminal of power device 12 energizes and de-energizes. Turn-on/turn-off control circuit 20 enables control of the energization and de-energization rates, to be further described with reference to FIG. 2.

When the DC signal is applied to the gate terminal of power device 12, high saturation voltage protection circuit 22 compares the voltage across the current carrying terminals to a threshold voltage to determine if an overvoltage or overcurrent condition exists. Upon such a condition, the gate terminal of power device 12 is shunted to the source terminal. Shunting inhibits biasing power device 12 conductive, thus preventing damage to the device when an overvoltage or overcurrent condition exists. As to be further described with reference to FIG. 2, when the gate and source terminals of power device 12 are shunted, a low resistance path that includes the secondary coil of isolation transformer 16 is created in the drive circuit. This results in an increase in current condition in the secondary coil of isolation transformer 16. The rise in current level also appears at the primary coil of isolation transformer 16 and the fault detector 24 senses the corresponding voltage rise at the output of logic level drivers 14 to determine that a fault has occurred.

Primary side fault detector 24 senses the voltage at the output of logic level drivers 14, as described above. A sample signal gates the voltage at the output of logic level drivers 14 into a circuit which holds that voltage for comparison to a predetermined voltage. When the sampled voltage exceeds a predetermined threshold, a fault signal is activated and relayed to the system controller.

Figure 2:
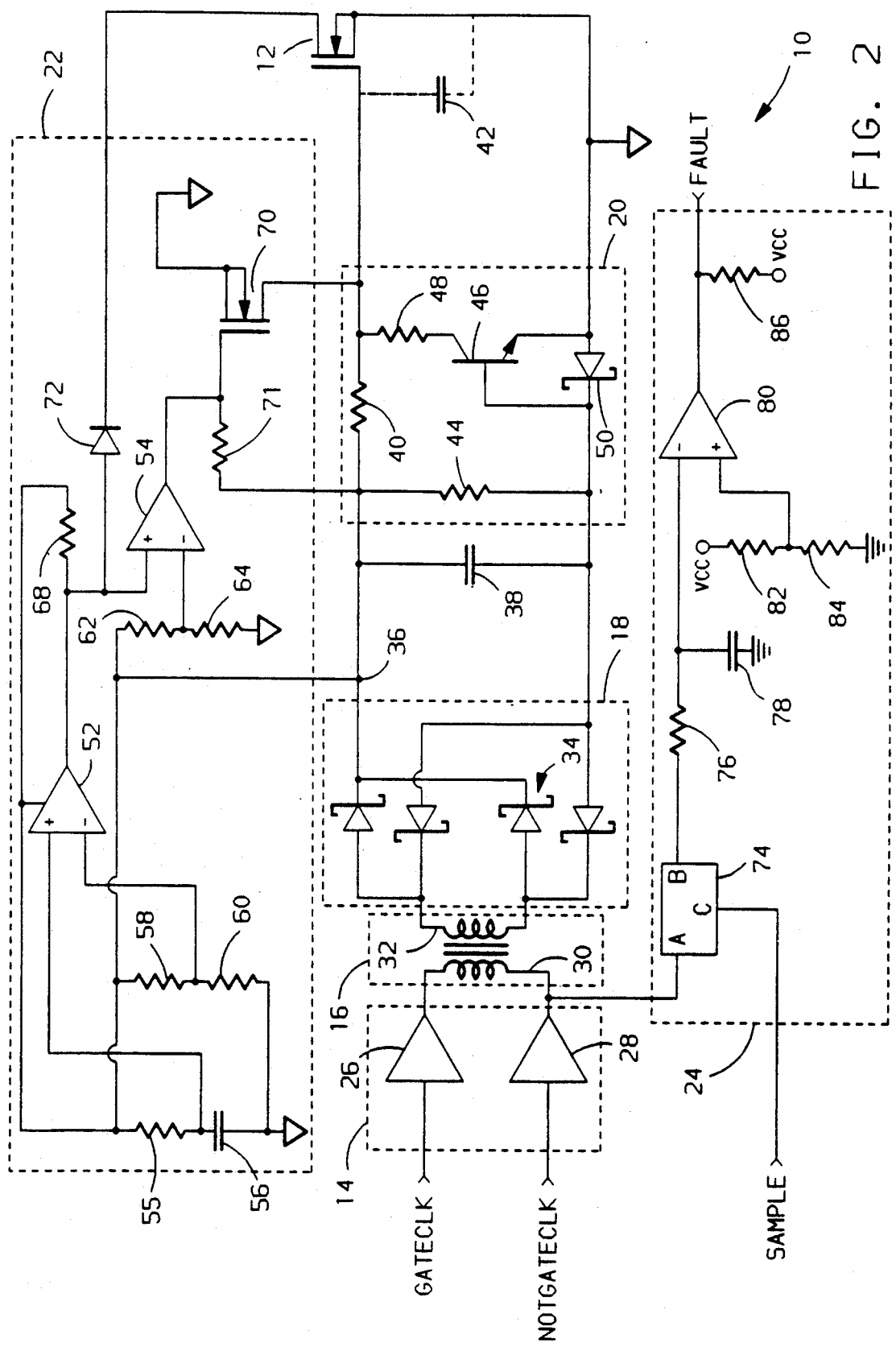
FIG. 2 is a circuit diagram of the fault detection apparatus shown in FIG. 1.

Referring to FIG. 2 and to the particulars of circuit 10 carrying out the functions as described in FIG. 1, a circuit diagram of the fault detection apparatus is shown. A low level, square wave signal (GATECLK) is applied to logic driver 26, and a second low level square wave signal (NOTGATECLK), 180 degrees out of phase from the GATECLK signal is applied to logic driver 28. Logic drivers 26 and 28 are low impedance drivers capable of operating at high frequencies. The output of logic drivers 26 and 28 is applied to primary coil 30 of isolation transformer 16 to create an AC signal which drives isolation transformer 16.

Secondary coil 32 of isolation transformer 16 drives the inputs of bridge rectifier 18, comprised of Schottky diodes 34, which demodulates the AC signal into a DC signal. The voltage level at node 36 is the high voltage reference for power device 12, turn-on/turn-off circuit 20 and high saturation voltage protection circuit 22. Capacitor 38 is a filter capacitor to eliminate voltage spikes. The DC signal provides power to the gate terminal of power device 12, turn-on/turn-off control circuit 20 and the high saturation protection circuit 22. It should be noted that with respect to ground symbols as depicted in the FIG. 2, there exists a logic ground that is the ground reference for the low impedance logic level drivers 14 and the primary side fault detector 24. On the secondary side of isolation transformer 16 is a local ground that is a common connection for power device 12, turn-on/turn-off control circuit 20, and high saturation voltage protection circuit 22.

When GATECLK and NOTGATECLK signals are applied, charge control circuit 20 is activated, and resistor 40 forms an RC circuit with the relatively high inherent gate-to-source capacitance of power device 12, depicted as gate capacitor 42. As gate capacitor 42 charges, the gate-source voltage rises, and power device 12 is biased conductive, allowing load current to flow between the current carrying terminals. To bias power device 12 nonconductive, GATECLK and NOTGATECLK are no longer applied to drivers 26 and 28. Thus, no DC voltage is applied to the turn-on/turn-off control circuit 20 or the gate terminal of power device 12. The voltage drop at the gate terminal will cause power device 12 to bias nonconductive. In such a case, because of the high inherent gate capacitance 42, it is necessary to provide a means to control the rate of de-energization of the gate terminal of power device 12. Accordingly, gate capacitor 42 discharges through resistors 40 and 44, raising the base-emitter voltage of transistor 46, biasing transistor 46 conductive. Biasing transistor 46 conductive enables current conduction through charge control resistor 48, the collector-emitter circuit of transistor 46, and Schottky diode 50. Resistor 48 thus forms an RC circuit with gate capacitance 42 to control the rate of discharge of the gate voltage. Schottky diode 50 enables transistor 46 to bias conductive because it open circuits the path of the gate capacitance discharge current between resistor 44 and local ground, maintaining the base voltage sufficiently higher than the emitter voltage.

Returning to the activation of the power device, once power device 12 is biased conductive, the high saturation voltage protection circuit 22 determines if power device 12 has failed to turn on or if an overcurrent condition has occurred. Under normal operation when power device 12 is initially biased conductive, the voltage difference between the current carrying terminals may be substantial, as one terminal is often connected to a negative or positive voltage rail, while the other terminal is at an intermediate voltage. If voltage protection circuit 22 immediately measured the voltage between the current carrying terminals, a fault condition could be falsely detected because the voltage between the terminals could be significant. After a time delay, if there is no fault upon activation of power device 12, the voltage difference between the current carrying terminals will be on the order of a transistor saturation voltage drop across a power semiconductor device. The time delay allows sufficient time for condition of current between the current carrying terminals so that the voltage across the current carrying terminals of power device 12 substantially approaches its saturation value.

The DC signal activates delay comparator 52 which enables the time delay before activation of comparator 54, which will compare a reference voltage to the drain-source voltage across power device 12. Resistor 55 and capacitor 56 form an RC circuit to effectuate a delay in the rise time of the voltage applied to the non-inverting input of delay comparator 52. The reference voltage applied to the inverting terminal of delay comparator 52 is derived by the divider action of resistors 58 and 60. By proper selection of resistors 55, 58, and 60 and capacitor 56, a sufficient time interval is introduced to delay activation of comparator 54.

Resistors 62 and 64 provide a reference voltage to the inverting input of comparator 54 through divider action. The voltage applied to the non-inverting input of comparator 54 is controlled by delay comparator 52. When GATECLK and NOTGATECLK are initially applied to bias power device 1 conductive, the output of delay comparator 52 is substantially equal to the local ground voltage. The output of delay comparator 52 will clamp the the non-inverting input voltage of comparator 54 to a value less than the inverting input voltage of comparator 54. This maintains the output of comparator 54 low, biasing transistor 70 nonconductive, and enables application of the gate signal to power device 12, biasing the device conductive.

Following the induced time delay, the voltage to the non-inverting input of delay comparator 52 rises above the reference voltage. The output of comparator 52 rises through pull-up resistor 68, causing the voltage at the non-inverting input of comparator 54 to rise to the equivalent of the sum of the voltage drops across diode 72 and the current carrying terminals of power device 12. Under normal operating conditions, the sum of these voltages is less than the reference voltage to comparator 54, and the output of the comparator 54 remains low. The gate of transistor 70 is clamped to local ground, biasing it nonconductive and enabling the DC signal to bias power device 12 conductive. If there is a fault condition, such as power device 12 fails to turn on or a high load current exists between the current carrying terminals, the voltage at the non-inverting input to comparator 54 will rise, causing the output of comparator 54 to rise, biasing transistor 70 conductive through pull-up resistor 71. The gate terminal of power device 12 is shunted to local ground, preventing power device 12 from biasing conductive and conducting load current.

If the gate terminal from power device 12 is shunted to local ground, a low resistance path is created from secondary coil 32 through resistor 40 and transistor 70, causing a high current to flow through secondary coil 32. By transformer action, the high current also flows through primary coil 30 of isolation transformer 16. The primary coil high current condition raises the voltage at the outputs of logic drivers 26 and 28 which primary side fault detector 24 detects to determine if a fault condition has occurred To detect this high current condition, the voltage at one of the the outputs of low impedance logic level driver 26 or 28 is sampled using sample and hold register 74. The signal SAMPLE gates the voltage into sample and hold register 74. This voltage is output through resistor 76, filtered by capacitor 78, to the inverting input of fault comparator 80. To the non-inverting input of fault comparator 80 is applied a reference voltage determined by a voltage divider comprised of resistors 82 and 84. The output of fault comparator 80, FAULT, signals the controller that an error has occurred. When the primary side voltage is below a threshold level, there is no fault condition, and the FAULT signal remains high via pull up resistor 86. When the primary side voltage exceeds the threshold level, there is a fault, and the output of fault comparator 80 drops, causing FAULT to go low.

As indicated above, this method of fault detection enables fault detection without the need for an additional transformer. The cost and complexity of the circuit required to isolate high power and low power circuits and also provide adequate fault detection is thus greatly reduced.

While this invention has been described in reference to the illustrated embodiment, it will be understood that the scope of the present invention is not limited thereto. Various modifications to the illustrated embodiment may occur to those skilled in the art, and it should be understood that systems incorporating such modifications may also within the scope of this invention, which is defined by the appended claims.

The embodiments of the invention in which an exclusive property or privilege is claimed are defined as follows:

1. Drive apparatus for a power semiconductor device having a pair of current carrying terminals and a gate terminal for controlling conduction of load current between said current carrying terminals, the drive apparatus comprising:

low level logic circuit means for generating an alternating current control signal indicative of a desired conduction pattern for said power semiconductor device;

input means including an isolation transformer and a circuit for demodulating said alternating current control signal to form a gate drive signal which is applied to the gate terminal of said power semiconductor device for controlling the conduction of load current in accordance with said desired conduction pattern;

protection means effective when the voltage across the current carrying terminals of said power semiconductor device exceeds a threshold corresponding to a fault condition for shunting said gate drive signal to ground, thereby preventing further conduction of said power semiconductor device; and fault detector means responsive to the alternating current control signal for generating/ a low level fault detection signal when the shunting of said gate drive signal by said protection means results in at least a predefined increase in the alternating current supplied to said input means.

2. The drive apparatus of claim 1, wherein the isolation transformer includes a primary coil to which said alternating current control signal is applied and a secondary coil driving input terminals of a bridge rectifier which demodulates the alternating current signal; and the fault detector means is responsive to said voltage at the primary coil of said isolation transformer.

3. The drive apparatus of claim 2, wherein the fault detector means includes:

sample means including a hold circuit for intermittently detecting and holding the voltage level of the alternating current signal at the primary coil of said isolation transformer;

means for comparing said detected voltage to a predetermined reference voltage to determine if the detected voltage exceeds the reference voltage; and fault signal generation means active when said detected voltage exceeds said predetermined voltage.

4. The drive apparatus of claim 1, wherein the protection means includes a means for comparing a predetermined reference voltage to the voltage across said current carrying terminals, signal means effective when the voltage across the current carrying terminals exceeds said predetermined reference voltage to activate said gate drive signal shunting means, gate drive signal shunting means activated by said signal means for preventing conduction between the current carrying terminals.

* * * * *